(12) United States Patent
Harame et al.

(10) Patent No.: US 8,415,763 B2
(45) Date of Patent: Apr. 9, 2013

(54) TUNABLE SEMICONDUCTOR DEVICE

(75) Inventors: David Louis Harame, Essex Junction, VT (US); Alvin Jose Joseph, Williston, VT (US); Qizhi Liu, Lexington, MA (US); Ramana Murty Malladi, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 36 days.

(21) Appl. No.: 13/076,781

(22) Filed: Mar. 31, 2011

(65) Prior Publication Data

US 2012/0248573 A1 Oct. 4, 2012

(51) Int. Cl.
*H01L 29/66* (2006.01)

(52) U.S. Cl. .................. 257/565; 257/197; 257/E31.069

(58) Field of Classification Search .................. 257/565, 257/197, E31.069
See application file for complete search history.

(56) References Cited

U.S. PATENT DOCUMENTS

| | | | |
|---|---|---|---|
| 3,770,516 A | 11/1973 | Duffy et al. | |
| 5,798,560 A * | 8/1998 | Ohkawa et al. | ............... 257/555 |
| 6,011,297 A | 1/2000 | Rynne | |
| 6,403,436 B1 | 6/2002 | Tanomura | |
| 7,001,806 B2 | 2/2006 | Tilke et al. | |
| 7,115,918 B2 | 10/2006 | Shen et al. | |
| 7,136,268 B2 | 11/2006 | Stricker et al. | |
| 7,550,787 B2 | 6/2009 | Coolbaugh et al. | |
| 7,709,930 B2 | 5/2010 | Stricker et al. | |
| 2007/0004160 A1 | 1/2007 | Voldman | |
| 2008/0217742 A1 | 9/2008 | Johnson et al. | |

* cited by examiner

*Primary Examiner* — Kimberly Rizkallah
*Assistant Examiner* — Timor Karimy
(74) *Attorney, Agent, or Firm* — Jason H Sosa; David A. Cain

(57) ABSTRACT

Embodiments of the invention include a method for forming a tunable semiconductor device and the resulting structure. The invention comprises forming a semiconductor substrate. Next, pattern a first mask over the semiconductor substrate. Dope regions of the semiconductor substrate not protected by the first mask to form a first discontinuous subcollector. Remove the first mask. Pattern a second mask over the semiconductor substrate. Dope regions of the semiconductor substrate not protected by the second mask and on top of the first discontinuous subcollector to form a second discontinuous subcollector. Remove the second mask and form a collector above the second discontinuous subcollector. Breakdown voltage of the device may be tuned by varying the gaps separating doped regions within the first and second discontinuous subcollectors. Doped regions of the first and second discontinuous subcollectors may be formed in a mesh pattern.

17 Claims, 4 Drawing Sheets

TUNABLE SEMICONDUCTOR DEVICE

BACKGROUND

This disclosure relates generally to semiconductor devices, and more specifically, to a semiconductor device where the breakdown voltage is tunable through the use of two discontinuous subcollectors.

The bipolar transistor is an electronic device with two pn junctions in very close proximity. There are three device regions: an emitter region, a base region, and a collector region. The two pn-junctions are known as the emitter-base junction and the collector-base junction. Modulation of the current in one pn-junction by means of a change in the bias of the other nearby pn-junction is called bipolar-transistor action. Because the mobility of minority carriers (electrons) in the base region of npn transistors is higher than that of holes in the base of pnp transistors, higher frequency operation and higher speed performances can be obtained with npn devices. For this reason, the following discussion is generally in the terms of npn transistors, but it is to be understood that the discussion is applicable to pnp transistors as well.

The desired device characteristics of bipolar transistors include: high current gain, high frequency ac operation, fast switching speed, high device-breakdown voltages, minimum device size, and high reliability of device operation.

In order for a semiconductor device to operate at a high voltage and at a high frequency, the doping concentrations of the various pn-junctions must be carefully controlled to provide depletion regions so that the device has the necessary breakdown voltage. As is known in the semiconductor art, there is a tradeoff between high operating voltages and high frequency operation. For example, to obtain a high breakdown voltage, the doping concentrations on each side of a pn-junction should be low, however, a low doping concentration increases the resistance of the device and will decrease the operating frequency.

To reduce this resistance, underneath the collector region with low doping concentrations may be a subcollector region that is heavily doped the same type as the collector. The subcollector provides a low resistance path from the active part of the transistor to a collector contact.

The manufacture of high performance bipolar transistors requires the reduction of the vertical profile of the device as well as the reduction of transistor parasitics. In order to reduce the collector-to-emitter transit time of the carriers, it is preferable to position the subcollector close to the collector-base junction. For example, to achieve 200 GHz fT, a thin collector (normally made by growing an epitaxial layer) must be used. However, no matter what selectively implanted collector profile is used, as the vertical profile is scaled, electric fields between the base and subcollector increase, resulting in higher avalanche multiplication and eventually to a lower collector-emitter breakdown voltage.

Ultimately, the maximum attainable breakdown voltage is a function of the distance between the base and the subcollector beneath it.

SUMMARY

Embodiments of the invention include a method for forming a tunable semiconductor device and the resulting structure. The invention comprises forming a semiconductor substrate. Next, pattern a first mask over the semiconductor substrate. Dope regions of the semiconductor substrate not protected by the first mask to form a first discontinuous subcollector. Remove the first mask. Pattern a second mask over the semiconductor substrate. Dope regions of the semiconductor substrate not protected by the second mask and on top of the first discontinuous subcollector to form a second discontinuous subcollector. Remove the second mask and form a collector above the second discontinuous subcollector.

BRIEF DESCRIPTION OF THE SEVERAL VIEWS OF THE DRAWINGS

The following detailed description, given by way of example and not intended to limit the disclosure solely thereto, will best be appreciated in conjunction with the accompanying drawings, in which.

DETAILED DESCRIPTION

Figure 1:
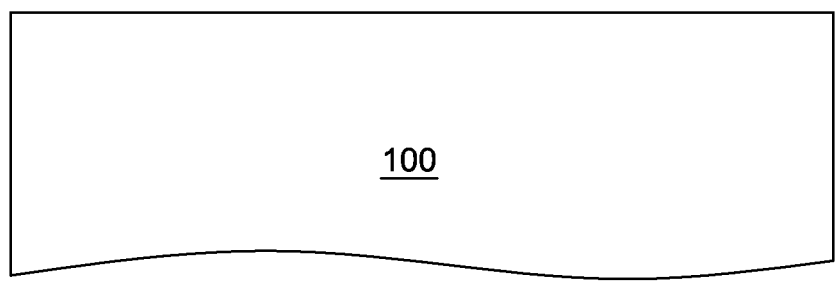
FIG. 1 depicts a semiconductor substrate upon which embodiments of the invention may be fabricated.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

FIG. 1 depicts a semiconductor substrate upon which embodiments of the invention may be fabricated. Semiconductor substrate 100 is preferably composed of a silicon containing material. Silicon containing materials include, but are not limited to, Si, single crystal Si, polycrystalline Si, SiGe, single crystal silicon germanium, polycrystalline silicon germanium, or silicon doped with carbon, amorphous Si and combinations and multi-layers thereof. Semiconductor substrate 100 may also be composed of other semiconductor materials, such as germanium, and compound semiconductor substrates, such as type III/V semiconductor substrates, e.g., GaAs. Although semiconductor substrate 100 is depicted as a bulk semiconductor substrate, semiconductor on insulator (SOI) substrate arrangements, such as silicon on insulator substrates, are also suitable for semiconductor substrate 100. Semiconductor substrate 100 is preferably a p-type substrate.

Figure 2:
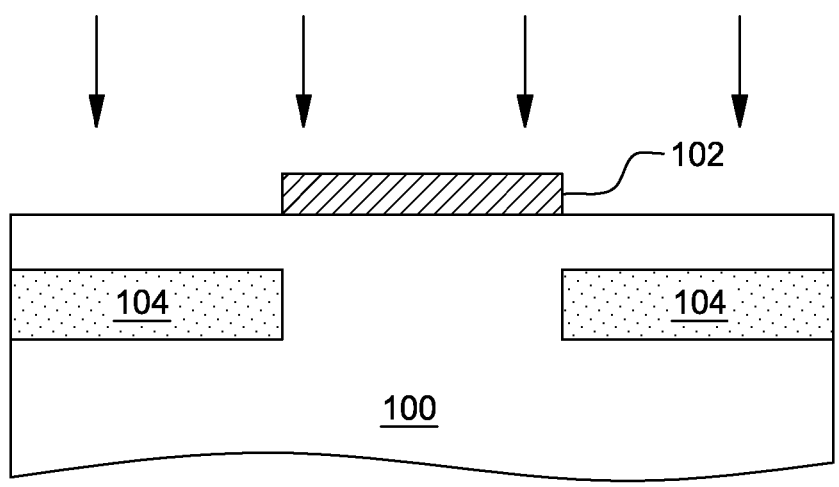
FIG. 2 illustrates a process of forming a first subcollector as a discontinuous layer in accordance with an illustrative embodiment.

FIG. 2 illustrates a process of forming a first subcollector as a discontinuous layer in accordance with an illustrative embodiment. FIG. 2 shows the portion of semiconductor substrate 100 shown in FIG. 1 with a mask 102 formed and etched on top of semiconductor substrate 100. Mask 102 is utilized to form subcollector 104 as a discontinuous layer (hereinafter discontinuous subcollector 104). Discontinuous subcollector 104 is formed by implanting impurities (doping) at a level below the top of semiconductor substrate 100, and may therefore be referred to as a deep implant. In order to minimize diffusion in subsequent processing steps, impurities (dopants) with relatively small diffusion constants such as arsenic (As) and antimony (Sb) may be used to form subcollector layers. The vertical depth of discontinuous subcollector 104 may be controlled by limiting implantation power and implantation exposure time. The gap (undoped region) within discontinuous subcollector 104 is defined by a lateral length and shape of mask 102, as the implantation occurs where semiconductor substrate 100 is not protected by mask 102.

In a preferred embodiment the implant is a heavy n+ type implant. To depict this heavy doping, discontinuous subcollector 104 may be referred to as an n++ type implant.

When viewing a cross-section, as depicted in FIG. 2, a discontinuous subcollector, such as discontinuous subcollector 104, appears to have two distinct doped regions. As such, when discussing a discontinuous subcollector, a first and second doped region, separated by a space or gap may be described. A person of skill in the art will understand that such a first and second doped region may actually be a single region completely surrounding a central gap or undoped region (like a ring surrounding an empty space).

After forming discontinuous subcollector 104, mask 102 is removed.

Figure 3:
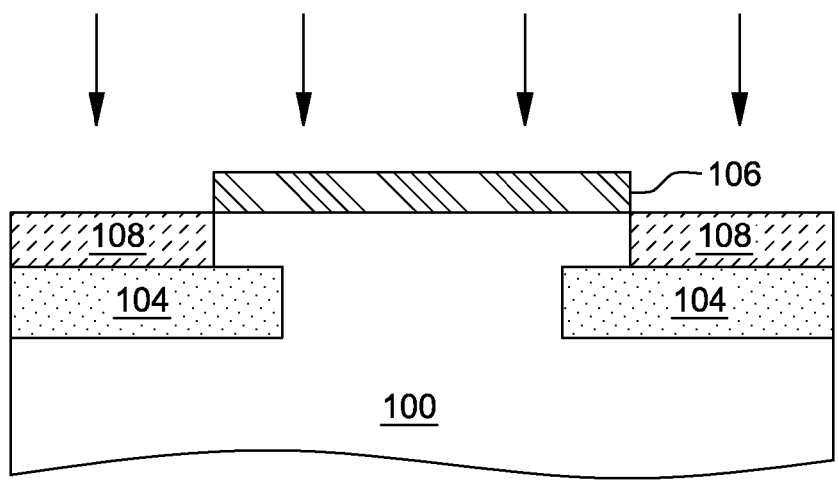
FIG. 3 depicts the process of forming a second subcollector as a discontinuous layer in accordance with an illustrative embodiment.

FIG. 3 depicts the process of forming a second subcollector as a discontinuous layer. Mask 106 is formed and etched over semiconductor substrate 100 and centered over the gap in discontinuous subcollector 104. Similar to the formation of discontinuous subcollector 104, semiconductor substrate 100 is doped/implanted where not protected by mask 106 to form a second subcollector 108 as a discontinuous layer (hereinafter discontinuous subcollector 108). Discontinuous subcollector 108 is preferably formed at the surface of semiconductor substrate 100 and may be referred to as a shallow implant. In a preferred embodiment, discontinuous subcollector 108 will also be an n++ type implant, though preferably of a higher dosage than discontinuous subcollector 104.

In a preferred embodiment mask 106 will have a greater lateral length than mask 102 had, resulting in a larger gap in discontinuous subcollector 108 than in discontinuous subcollector 104. After the formation of discontinuous subcollector 108, mask 106 is removed.

Figure 4:
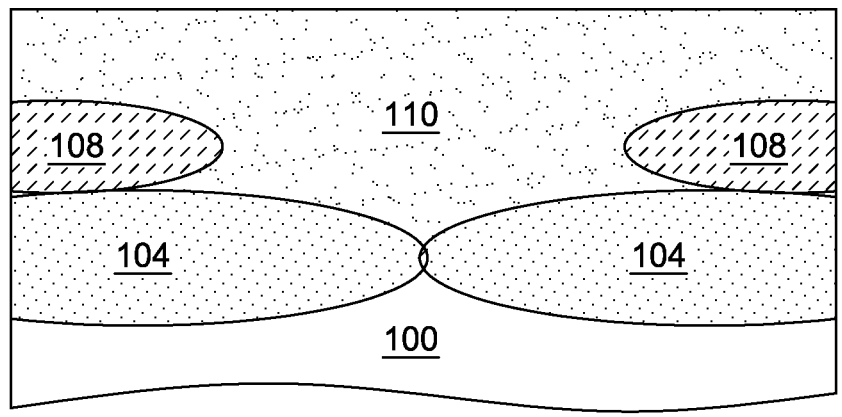
FIG. 4 illustrates the formation of a collector through the growth of an epitaxial layer in accordance with an illustrative embodiment.

FIG. 4 illustrates the formation of a collector through the growth of an epitaxial layer in accordance with an illustrative embodiment.

In this depiction, an epitaxial layer is grown, e.g., using vapor-phase epitaxy, on the surface of the substrate above discontinuous subcollectors 104 and 108. The epitaxial layer is preferably a single-crystal layer that continues the crystal structure of semiconductor substrate 100. This makes the epitaxial layer suitable for the fabrication of devices. With a light doping, this layer becomes collector 110. Collector 110 is often doped with small diffusivity elements such as As.

In the process of forming collector 110, due to increased temperature, discontinuous subcollectors 104 and 108 diffuse both vertically and horizontally. In a preferred embodiment, discontinuous subcollector 104 will diffuse horizontally just enough to form an extremely thin highly doped region across the gap in discontinuous subcollector 104, giving an increased amount of space between the subcollector and a base (of a device) to increase the maximum breakdown voltage. The lengths of the gaps within discontinuous subcollectors 104 and 108 may be varied to tune the breakdown voltage.

The doping within collector 110 has a lower impurity concentration (preferably of n+ type) than either discontinuous subcollector 104 or discontinuous subcollector 108. Therefore, preferably, collector 110 will have a first doping concentration, discontinuous subcollector 104 will have a second doping concentration higher than the first doping concentration, and discontinuous subcollector 108 will have an even higher third doping concentration. The doping of collector 110 may be referred to as an auto-doping process because collector 110 may be automatically lightly doped through diffusion without requiring additional impurity implantation steps. In other embodiments, additional impurities of the same type may still be implanted in collector 110.

In another embodiment, discontinuous subcollector 104 may be implanted further beneath the surface of semiconductor substrate 100, and discontinuous subcollector 108 may be a deep implant above discontinuous subcollector 104, but also below the surface. In such an embodiment, a surface layer of the semiconductor substrate 100 above discontinuous subcollectors 104 and 108 may be implemented as collector 110 without the need for the growth of an epitaxial layer.

Figure 5:
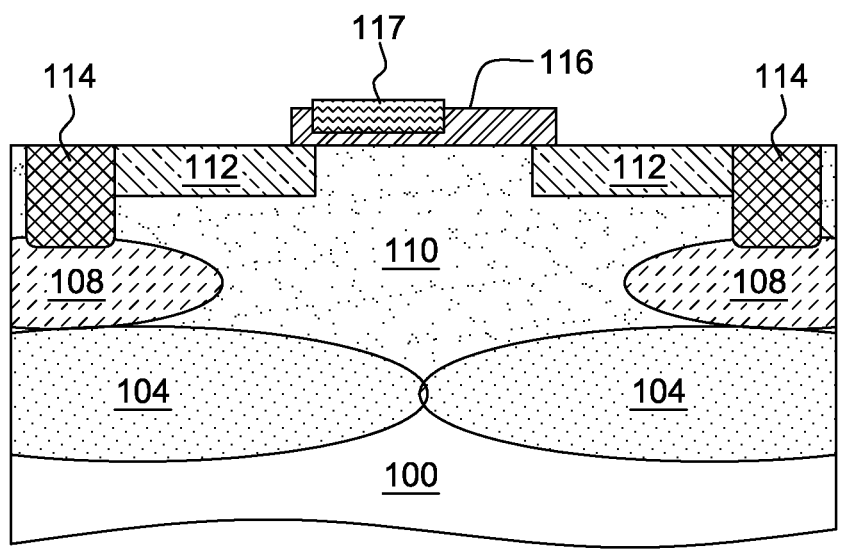
FIG. 5 depicts one example of completing a device region for the semiconductor device.

FIG. 5 depicts one example of completing a device region for the semiconductor device. Conventional, well-known processes may be used to form shallow trench isolation layers 112. Collector contact regions 114 may be formed to connect a surface of the semiconductor device to discontinuous subcollector 108, so that an electrical connection may be made. Collector contact regions 114 will preferably be doped with same type as discontinuous subcollector 108.

Base structure 116 may be formed embedded in collector 110, or may preferably be formed on top of collector 110. Base structure 116 is doped the opposite of the collector 110, preferably p-type. Upon the base structure 116, emitter structure 117 of the same type as the collector, preferably n++ type, may be placed, along with various isolation layers and wiring levels.

The entire semiconductor device, as depicted in FIG. 5, may be surrounded by deep trench isolation to separate the device from other devices on the same chip.

Figure 6:
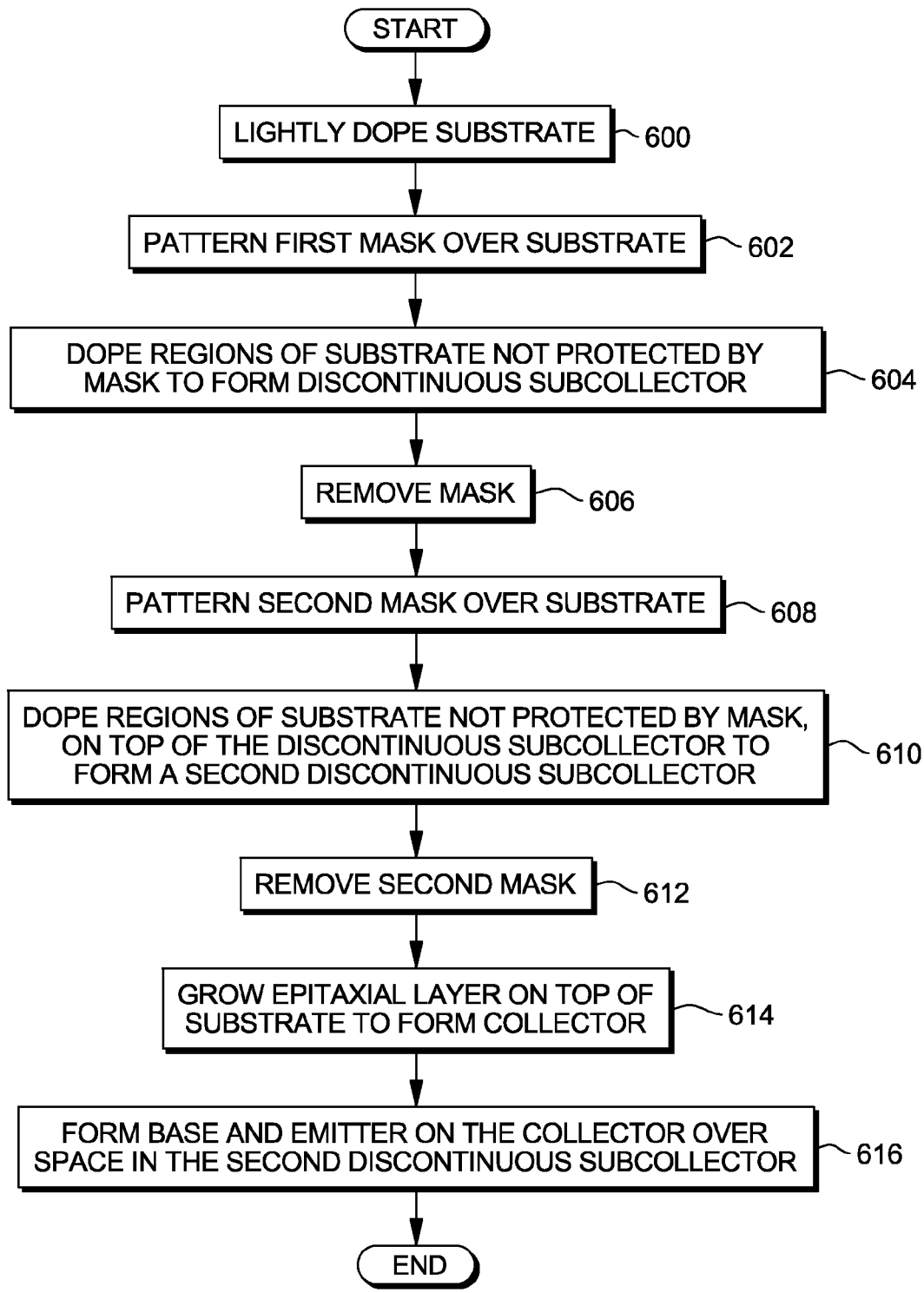
FIG. 6 illustrates a flowchart of a process for the construction of the semiconductor device in accordance with an embodiment of the invention.

FIG. 6 illustrates a flowchart of a process for the construction of the semiconductor device in accordance with an embodiment of the invention.

The invention begins by forming a semiconductor substrate and lightly doping the substrate (step 600). Next, pattern a first mask over the substrate (step 602). With the first mask in place, dope regions of the substrate, beneath the surface of the substrate, not protected by the first mask to form a first discontinuous subcollector (step 604). The spacing or gap in the discontinuous subcollector is a function of the length and shape of the first mask. After the formation of the first discontinuous subcollector, remove the first mask (step 606).

Pattern a second mask over the substrate (step 608). The second mask is preferably longer than the first mask. Dope regions of the substrate, at the surface of the substrate, not protected by the second mask and on top of the first discontinuous subcollector to form a second discontinuous subcollector (step 610). After the formation of the second discontinuous subcollector, remove the second mask (step 612). The first and second masks, and hence the size and shape of the gaps in the discontinuous subcollectors, may vary in horizontal lengths, allowing the breakdown voltage of the semiconductor device to be tuned.

Upon the substrate, which now includes the first and second discontinuous subcollectors, grow an epitaxial layer to form a collector (step 614). The collector will be doped of the same type as the first and second discontinuous subcollectors, but to a lesser degree. In one embodiment, this doping will occur automatically. It is during this step that first and second discontinuous subcollectors will diffuse vertically and horizontally.

On top of the collector, form a base and emitter structure over the center of the gap in the second discontinuous subcollector (step 616) to complete the device. Shallow trench isolation, deep trench isolation, embedded contacts and other finishing steps may also be taken once the collector has been formed.

Figure 7:
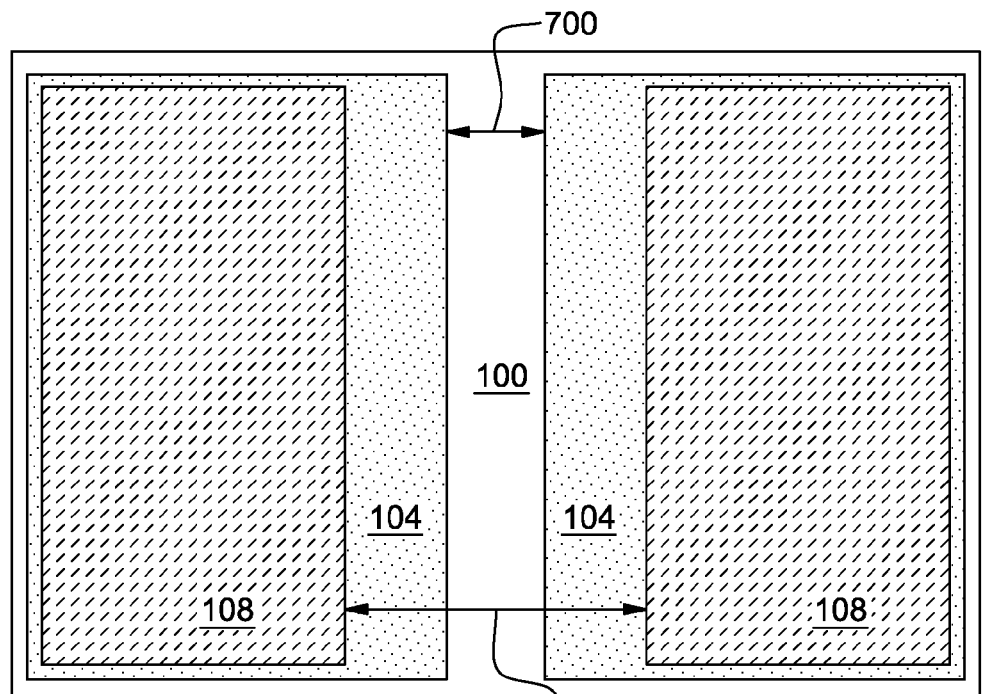
FIG. 7 depicts a bird's eye view of the bottom layers of the semiconductor device in accordance to an illustrative embodiment.

FIG. 7 depicts a bird's eye view of the bottom layers of the semiconductor device in accordance to an illustrative embodiment. Substrate 100 is shown at the very bottom of the stack with discontinuous subcollector 104 formed on top of it. Discontinuous subcollector is broken up into two regions by gap 700. Gap 700 will preferably be between 0 and 4 µm. In another embodiment, gap 700 may be the same length in all direction and discontinuous subcollector 104 may form a ring around gap 700. Discontinuous subcollector 108 is formed on top of discontinuous subcollector 104 with two distinct doped regions of discontinuous subcollector 108 separated by gap 702. Gap 702 is also preferably in the range of 0 to 4 µm. Gap 702 is also preferably longer than gap 700. Similar to the discontinuous subcollector 104, in one embodiment, discontinuous subcollector 108 may form a ring around a centered gap 702 of equal lengths in all directions.

An emitter and gate (not shown) would be centered over gaps 700 and 702.

Figure 8:
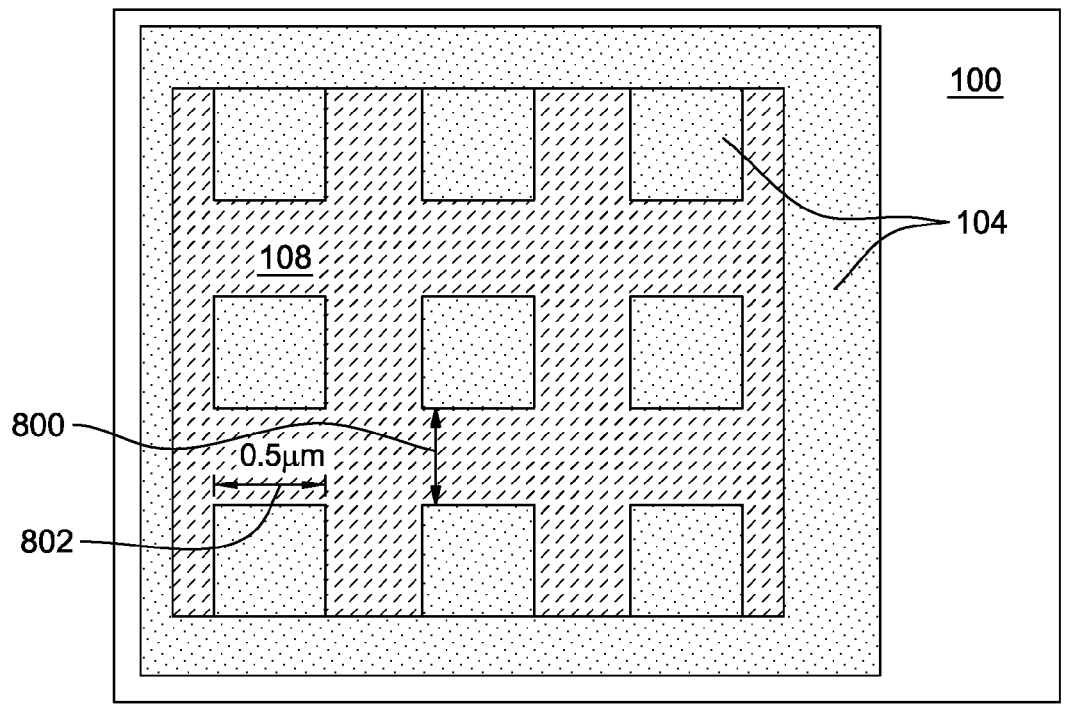
FIG. 8 illustrates an alternate doping pattern of doped regions of a discontinuous subcollector in accordance with an illustrative embodiment.

FIG. 8 illustrates an alternate doping pattern of doped regions of discontinuous subcollectors 104 and 108 on top of substrate 108 in accordance with an illustrative embodiment. In this example, the left hand side of FIG. 7 is shown, with the alternate doping pattern.

In this example, the alternate doping pattern used on discontinuous subcollector 108 is a mesh pattern. Patterning a doped region with a mesh pattern allows a chip designer greater control of lateral diffusion during subsequent processing steps. The mesh pattern may be created by patterning a photoresist layer over the substrate in addition to the first and second masks 102 and 106 and then doping the unprotected areas. This creates undoped subregions within a doped region of a discontinuous subcollector. Length 802 of an undoped region in discontinuous subcollector 108 is determined by the thickness of the photoresist, typically no less the one quarter (¼) of the height of the photoresist. An exemplary length is 0.5 µm, though in other embodiments this may be greater or less. Distance 800 is the distance between the undoped regions. In a preferred embodiment distance 800 is about the distance of length 802. In other embodiments distance 800 may exceed length 802. Distance 800 is ultimately selected to reach a desired lateral diffusion distance for discontinuous subcollector 108.

In another embodiment, discontinuous subcollector 108 is devoid of a mesh pattern, while discontinuous subcollector 104 comprises a mesh pattern. In another embodiment still, both discontinuous subcollectors 104 and 108 comprise mesh pattern doping.

The resulting semiconductor device may be included on a semiconductor substrate comprising many devices and one or more wiring levels to form an integrated circuit chip.

The resulting integrated circuit chip(s) can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Having described preferred embodiments of a tunable semiconductor device (which are intended to be illustrative and not limiting), it is noted that modifications and variations may be made by persons skilled in the art in light of the above teachings. It is therefore to be understood that changes may be made in the particular embodiments disclosed which are within the scope of the invention as outlined by the appended claims.

What is claimed is:

1. A semiconductor device, comprising:
a semiconductor substrate;

a first discontinuous subcollector, wherein the first discontinuous subcollector comprises a first doped region and a second doped region separated by a first space;
a second discontinuous subcollector on top of the first discontinuous subcollector, wherein the second discontinuous subcollector comprises a first doped region and a second doped region separated by a second space;
a single continuous collector formed over the first and second discontinuous subcollectors and within at least the second space of the second discontinuous subcollector; and
a base structure and an emitter structure over the second space separating the first and second doped regions of the second discontinuous subcollector, wherein at least part of the collector separates the base structure from the second discontinuous subcollector.

2. The semiconductor device of claim 1, wherein the first and second doped regions of at least one of the first and second discontinuous subcollectors connect on opposite ends of a space separating the first and second doped regions of the at least one of the first and second discontinuous subcollectors to form one doped region surrounding the space.

3. The semiconductor device of claim 1, wherein the first and second doped regions of both the first and second discontinuous subcollectors have expanded, through diffusion, both vertically and horizontally.

4. The semiconductor device of claim 1, wherein expanded regions of the first and second doped regions of the first discontinuous subcollector overlap.

5. The semiconductor device of claim 1, wherein breakdown voltage of the semiconductor device is tunable by varying lengths of the first and second spaces separating the first and second doped regions of the first and second discontinuous subcollectors.

6. The semiconductor device of claim 5, wherein the length of the second space is not equal to the length of the first space.

7. The semiconductor device of claim 5, wherein the length of the second space is greater than the length of the first space.

8. The semiconductor device of claim 1, wherein a doping concentration of the collector is less than a doping concentration of the first discontinuous subcollector, and the doping concentration of the first discontinuous subcollector is less than a doping concentration of the second discontinuous subcollector.

9. A semiconductor device, comprising:
a semiconductor substrate;
a first discontinuous subcollector, wherein the first discontinuous subcollector comprises a first doped region and a second doped region separated by a first space;
a second discontinuous subcollector on top of the first discontinuous subcollector, wherein the second discontinuous subcollector comprises a first doped region and a second doped region separated by a second space;
wherein the first and second doped regions of at least one of the first and second discontinuous subcollectors connect on opposite ends of a space separating the first and second doped regions of the at least one of the first and second discontinuous subcollectors to form one doped region surrounding the space;
a collector formed over the first and second discontinuous subcollectors; and
a base structure and an emitter structure over the second space separating the first and second doped regions of the second discontinuous subcollector, wherein at least part of the collector separates the base structure from the second discontinuous subcollector.

10. The semiconductor device of claim 9, wherein the first and second doped regions of both the first and second discontinuous subcollectors have expanded, through diffusion, both vertically and horizontally.

11. The semiconductor device of claim 9, wherein expanded regions of the first and second doped regions of the first discontinuous subcollector overlap.

12. The semiconductor device of claim 9, wherein the length of the second space is not equal to the length of the first space.

13. The semiconductor device of claim 9, wherein the length of the second space is greater than the length of the first space.

14. The semiconductor device of claim 9, wherein a doping concentration of the collector is less than a doping concentration of the first discontinuous subcollector, and the doping concentration of the first discontinuous subcollector is less than a doping concentration of the second discontinuous subcollector.

15. A semiconductor device, comprising:
a semiconductor substrate;
a first subcollector, wherein the first subcollector comprises a first doped region and a second doped region, connected through diffusion to form a single doped region with a center region thinner than an outer region of the first subcollector;
a second subcollector formed over the first subcollector, wherein at least a first doped region of the second subcollector is separated by a break in the second subcollector from at least a second doped region of the second subcollector;
wherein the center region of the first subcollector is exposed through the break in the second subcollector;
a single continuous collector formed over the first and second subcollectors and within the break of the second subcollector; and
a base structure and an emitter structure over the center region of the first subcollector, wherein at least part of the collector separates the base structure from the center region.

16. The semiconductor device of claim 15, wherein doped regions of the second subcollector form a continuous path around the break in the second subcollector.

17. The semiconductor device of claim 15, wherein a doping concentration of the collector is less than a doping concentration of the first subcollector, and the doping concentration of the first subcollector is less than a doping concentration of the second subcollector.

* * * * *